(12) United States Patent
Ichikawa

(10) Patent No.: US 9,534,894 B2
(45) Date of Patent: Jan. 3, 2017

(54) RESONATOR ELEMENT, GYRO SENSOR ELEMENT, ELECTRONIC DEVICE, ELECTRONIC APPARATUS, AND MOVING OBJECT

(71) Applicant: SEIKO EPSON CORPORATION, Tokyo (JP)

(72) Inventor: Fumio Ichikawa, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 154 days.

(21) Appl. No.: 14/644,770

(22) Filed: Mar. 11, 2015

(65) Prior Publication Data

US 2015/0270825 A1   Sep. 24, 2015

(30) Foreign Application Priority Data

Mar. 19, 2014   (JP) .................. 2014-056091

(51) Int. Cl.
| | | |
|---|---|---|
| *G01C 19/56* | (2012.01) | |
| *G01C 19/5607* | (2012.01) | |
| *H03H 9/21* | (2006.01) | |
| *G01C 19/5621* | (2012.01) | |
| *H03H 9/05* | (2006.01) | |
| *H03H 9/10* | (2006.01) | |

(52) U.S. Cl.
CPC ....... *G01C 19/5607* (2013.01); *G01C 19/5621* (2013.01); *H03H 9/21* (2013.01); *H03H 9/0547* (2013.01); *H03H 9/1014* (2013.01)

(58) Field of Classification Search
CPC .... G01C 19/5607; G01C 19/5621; H03H 9/21
See application file for complete search history.

(56) References Cited

U.S. PATENT DOCUMENTS

| | | | |
|---|---|---|---|
| 6,046,531 A | 4/2000 | Kikuchi et al. | |
| 8,018,127 B2 * | 9/2011 | Kikushima | ............. H03H 3/02 310/370 |
| 2002/0121941 A1 | 9/2002 | Sakata et al. | |
| 2011/0227451 A1 | 9/2011 | Yamazaki | |

FOREIGN PATENT DOCUMENTS

| | | |
|---|---|---|
| JP | H11-72333 A | 3/1999 |
| JP | 2002-261576 A | 9/2002 |
| JP | 2006-184176 A | 7/2006 |
| JP | 2006-208261 A | 8/2006 |
| JP | 2012-029023 A | 2/2012 |
| JP | 2012-142666 A | 7/2012 |

* cited by examiner

*Primary Examiner* — John Chapman, Jr.
(74) *Attorney, Agent, or Firm* — Oliff PLC

(57) ABSTRACT

In order to provide a resonator element having high production efficiency and low impedance in a small size, the resonator element includes a base portion, and a driving arm which extends from the base portion and includes a through hole, in which the driving arm vibrates along an in-plane direction, and includes a plurality of broad portions of which a width in the in-plane direction is broad and a plurality of narrow portions of which a width in the in-plane direction is narrow which alternate with each other, and the through hole is disposed in the broad portion.

21 Claims, 8 Drawing Sheets

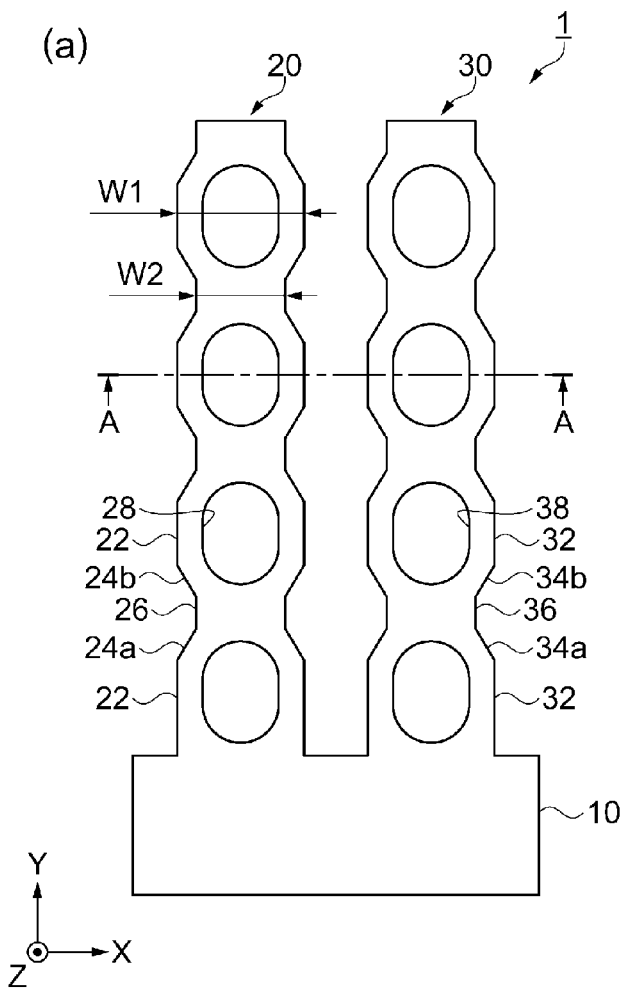
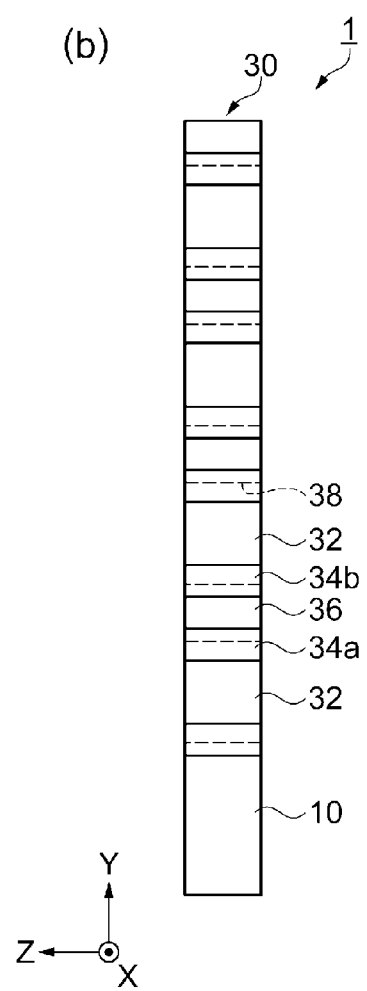
FIG. 1A   FIG. 1B
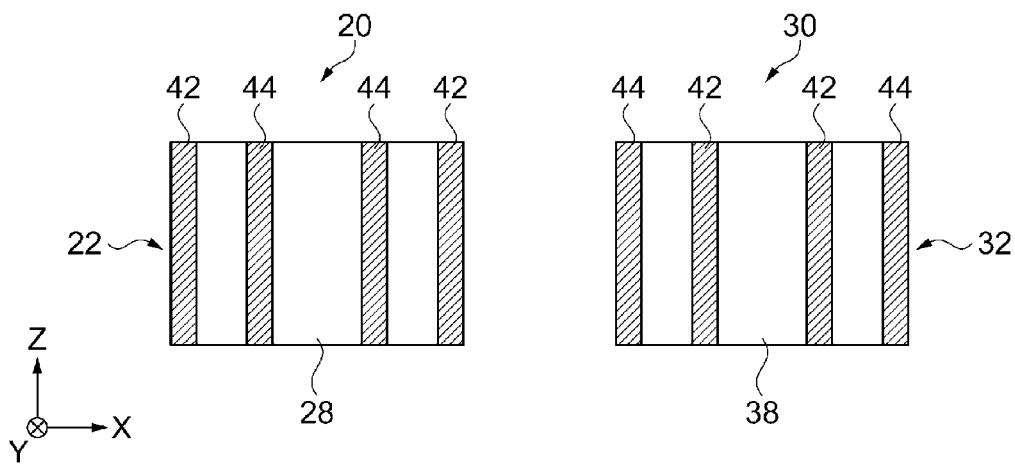
FIG. 2

RESONATOR ELEMENT, GYRO SENSOR ELEMENT, ELECTRONIC DEVICE, ELECTRONIC APPARATUS, AND MOVING OBJECT

BACKGROUND

1. Technical Field

The present invention relates to a resonator element, a gyro sensor element, an electronic device, an electronic apparatus, and a moving object.

2. Related Art

In the related art, a resonator element or a gyro sensor element is used for an electronic apparatus such as a mobile phone or a digital camera, and a moving object such as an automobile. According to a demand for a high performance of the electronic apparatus or the moving object, low impedance or an improvement in detection sensitivity is required for the resonator element or the gyro sensor element. For example, in JP-A-2002-261576, a resonator piece is disclosed in which a rigidity reinforcement portion reinforcing a through groove and the through groove are disposed in a driving arm portion. In addition, in JP-A-2006-208261, an inertial sensor is disclosed in which a plurality of through holes is arranged in a driving arm portion for excitation. A resonator piece and an inertial sensor are known in which rigidity of the driving arm increases due to such a configuration, and impedance (a CI value, and series equivalent resistance) is able to be decreased by forming an electrode for excitation in a side surface of the driving arm, and a side surface of the through groove or the through hole facing the side surface of the driving arm.

However, recently, downsizing of the resonator element or the gyro sensor element has progressed, and a width of the driving arm has been remarkably narrowed. The through hole disposed for decreasing the impedance of the element is also narrowed, and thus it is difficult to dispose the through hole having a large opening area. In contrast, broadening a width dimension of the driving arm and enlarging the through hole may be considered. However, when the width of the driving arm is W, and a length of the driving arm is L, a vibrational frequency f of the driving arm has to satisfy the following relationship.

$$f \propto W/L^2 \qquad \text{Expression 1}$$

For this reason, the length of the driving arm has to be elongated as the width of the driving arm becomes broader, and thus external dimensions of the driving arm increase. That is, it is difficult to provide a resonator element and a gyro sensor element having low impedance in a small size.

SUMMARY

An advantage of some aspects of the invention is to solve at least a part of the problems described above, and the invention can be implemented as the following forms or application examples.

Application Example 1

A resonator element according to this application example includes: a base portion; and a driving arm extending from the base portion and including a through hole, in which the driving arm vibrates along an in-plane direction, and includes a plurality of broad portions of which a width in the in-plane direction is broad, and a plurality of narrow portions of which a width in the in-plane direction is narrow which alternate with each other, and the through hole is disposed in a position overlapping with the broad portion.

According to this application example, the resonator element includes the driving arms which extend in parallel from the base portion and is able to vibrate in the in-plane direction in a plan view. In the driving arm, the broad portion of which the width in the in-plane direction is broad and the narrow portion of which the width in the in-plane direction is narrow alternate with each other toward the leading end of the driving arm from the base portion are provided, and the broad portion is provided with the through hole for decreasing impedance. In the broad portion, it is possible to form the through hole having a large opening area. However, in order to form the through hole having a large opening area, when the broad portion is disposed in the driving arm of the resonator element vibrating at a predetermined frequency, a vibrational frequency of the resonator element exceeds the predetermined frequency. In order to decrease the vibrational frequency which has been increased by the broad portion, for example, it is necessary to elongate the length of the driving arm, and external dimensions of the resonator element increase. Thus, in the driving arm of the resonator element of this application example, the narrow portion is disposed. Accordingly, an increase in the vibrational frequency due to the broad portion is able to be suppressed by the narrow portion. Therefore, it is possible to provide the resonator element with high production efficiency and low impedance in a small size.

Application Example 2

In the resonator element according to the application example described above, it is preferable that the driving arm includes an inclined portion of which a width in the in-plane direction gradually decreases toward the narrow portion from the broad portion in a plan view of the driving arm.

According to this application example, the driving arm includes the inclined portion of which the width in the in-plane direction gradually narrows toward the narrow portion from the broad portion between the broad portion and the narrow portion. Accordingly, it is possible to improve rigidity of the driving arm.

Application Example 3

In the resonator element according to the application example described above, it is preferable that the width of the narrow portion in the in-plane direction is greater than or equal to 88% and less than or equal to 99% of the broad portion.

According to this application example, the narrow portion of which the width is less than or equal to 99% of the broad portion and the broad portion are disposed in the driving arm. The narrow portion is able to decrease the vibrational frequency exceeding the predetermined frequency due to disposing the broad portion. However, when the narrow portion which is extremely narrow is disposed, rigidity of the driving arm decreases, and thus the impedance increases. Then, in the resonator element of the application example, the narrow portion of which the width is greater than or equal to 88% of the broad portion is disposed in the driving arm. Accordingly, it is possible to realize the resonator element having low impedance. Therefore, it is possible to provide the resonator element having low impedance in a small size.

Application Example 4

In the resonator element according to the application example described above, it is preferable that the through hole is approximately in the shape of a rectangle having a long side in an extending direction of the driving arm in which at least one corner portion of the rectangle is rounded in a plan view of the driving arm.

According to this application example, in the driving arm, the through hole in the shape of a rectangle having the long side in the extending direction of the driving arm in which at least one corner portion of the rectangle is rounded is disposed in a plan view. By rounding the corner portion of the rectangular through hole, rigidity of the driving arm is improved. In other words, by rounding the corner portion, it is possible to form the through hole which extends in the extending direction of the driving arm in the driving arm.

Application Example 5

A gyro sensor element according to this application example includes: the resonator element according to the application example described above as a driving arm; and a detection arm extending from a base portion on a side opposite to the driving arm and detecting a vibration in an out-of-plane direction intersecting with the in-plane direction.

According to this application example, the gyro sensor element includes the resonator element having high production efficiency and low impedance in a small size in the driving arm. Therefore, it is possible to provide the gyro sensor element having high production efficiency and improved driving efficiency of the driving arm in a small size.

Application Example 6

In the gyro sensor element according to the application example described above, it is preferable that the detection arm includes a through hole which is approximately in the shape of a rectangle toward a leading end direction of the detection arm from the base portion side of the detection arm in a plan view of the detection arm.

According to this application example, in the detection arm of the gyro sensor element, the through hole for decreasing the impedance is disposed. Therefore, it is possible to provide the gyro sensor element having high production efficiency and improved detection sensitivity in a small size.

Application Example 7

An electronic device according to this application example includes: the resonator element according to the application example described above or the gyro sensor element according to the application example described above.

According to this application example, it is possible to provide the electronic device including the resonator element or the gyro sensor element with high production efficiency and low impedance in a small size.

Application Example 8

An electronic apparatus according to this application example includes: the resonator element according to the application example described above or the gyro sensor element according to the application example described above.

According to this application example, it is possible to provide the electronic apparatus including the resonator element or the gyro sensor element with high production efficiency and low impedance in a small size.

Application Example 9

A moving object according to this application example includes: the resonator element according to the application example described above or the gyro sensor element according to the application example described above.

According to this application example, it is possible to provide the moving object including the resonator element or the gyro sensor element with high production efficiency and low impedance in a small size.

BRIEF DESCRIPTION OF THE DRAWINGS

The invention will be described with reference to the accompanying drawings, wherein like numbers reference like elements.

FIGS. 1A and 1B are a schematic plan view and a side view schematically illustrating a configuration of a resonator element according to Embodiment 1.

FIG. 2 is a cross-sectional view cut along line A-A in FIG. 1A.

DESCRIPTION OF EXEMPLARY EMBODIMENTS

Figure 3A:
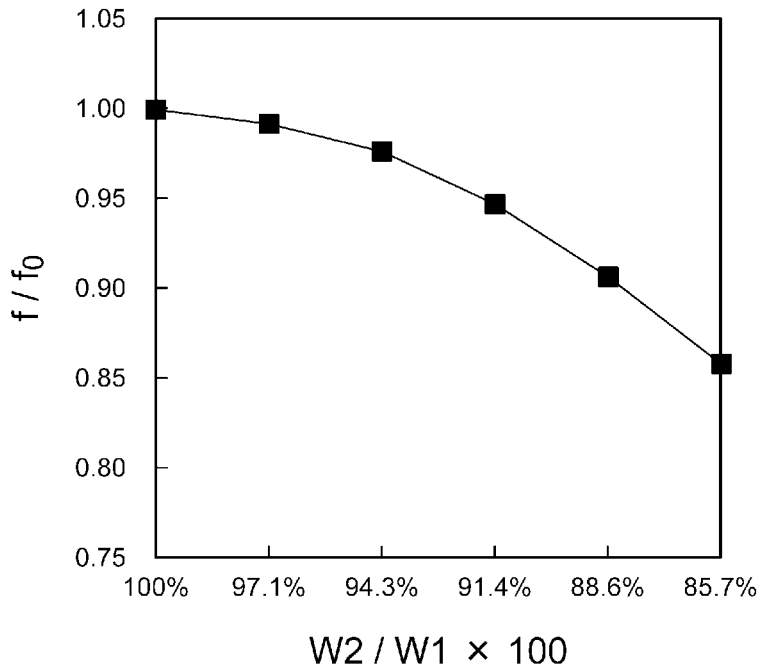
FIGS. 3A and 3B are graphs illustrating a relationship between a narrow portion/a broad portion and vibrational frequency, and a relationship between a narrow portion/a broad portion and impedance.

Hereinafter, embodiments of the invention will be described with reference to the drawings. Furthermore, in the following respective drawings, each layer or each member is enlarged to be recognizable, and thus a scale of each layer or each member is different from actual dimensions.

Embodiment 1

Resonator Element

FIG. 1A is a schematic plan view schematically illustrating a configuration of a resonator element according to Embodiment 1. FIG. 1B is a side view thereof. FIG. 2 is a cross-sectional view cut along line A-A in FIG. 1A. In FIGS. 1A and 1B, FIG. 2, and FIGS. 6A and 6B, FIG. 7, and FIG. 8 described later, for convenience of description, an X axis, a Y axis, and a Z axis are illustrated as three axes orthogonal to each other, and a leading end side of an illustrated arrow is a "+ side", and a base end side is a "− side". In addition, in the following description, a direction parallel with the X axis is referred to as an "X axis direction", a direction parallel with the Y axis is referred to as a "Y axis direction", and a direction parallel with the Z axis is referred to as a "Z axis direction".

First, a schematic configuration of the resonator element according to Embodiment 1 will be described with reference to FIGS. 1A and 1B and FIG. 2.

As illustrated in FIGS. 1A and 1B, a resonator element 1 includes a base portion 10, a pair of driving arms 20 and 30 extending from the base portion 10, and the like. Specifically, the resonator element 1 includes the pair of driving arms 20 and 30 in the shape of a prism which extend approximately in parallel with each other in the Y axis direction from one end of the approximately rectangular flat plate-like base portion 10 on a +Y side. The base portion 10 and the driving arms 20 and 30 configuring the resonator element 1 are integrally formed, and crystal is used as a base material. Furthermore, the resonator element 1 of this Embodiment 1 is formed by a photolithographic method and a dry etching method using fluorine-based gas or the like.

The crystal includes an X axis referred to as an electrical axis, a Y axis referred to as a mechanical axis, and a Z axis referred to as an optical axis. The base material of the resonator element 1 is cut out along a plane surface which is defined by the X axis and the Y axis orthogonal to a crystallographic axis of the crystal, is processed to be in the shape of a flat plate, and has a predetermined thickness in the Z axis direction orthogonal to the plane surface. As the Z axis, an axis which is rotated in a range of 0 degrees to 2 degrees based on the X axis and cut out is able to be used. The predetermined thickness is suitably set according to a vibrational frequency, an external size, workability, and the like.

The driving arm 20 includes a broad portion 22 of which a width W1 in the X axis direction is broad, a narrow portion 26 of which a width W2 in the X axis direction is narrow, and inclined portions 24a and 24b of which a width in the X axis direction gradually decreases toward the narrow portion 26 from the broad portion 22. In the driving arm 20, the broad portion 22, the inclined portion 24a, the narrow portion 26, and the inclined portion 24b are repeatedly formed in this order toward a leading end direction of the driving arm 20 from a +X side of the base portion 10, and four broad portions 22 are disposed. The inclined portion 24a or the inclined portion 24b is disposed between the broad portion 22 and the narrow portion 26, and thus it is possible to increase rigidity of the driving arm 20.

In a position overlapping with the broad portion 22 of the driving arm 20, a through hole 28 opening in the Z axis direction is disposed. By disposing the broad portion 22 in the driving arm 20, a broad through hole 28 opening in the X axis direction is able to be disposed. The through hole 28 is in the shape of a round cornered rectangle in which corner portions of the rectangle having a long side in the Y axis direction are rounded. A rounded corner portion of the round cornered rectangle is arranged along the inclined portions 24a and 24b, and thus the broad through hole 28 opening in the Y axis direction is able to be disposed.

The driving arm 30 includes a broad portion 32 of which a width W1 in the X axis direction is broad, a narrow portion 36 of which a width W2 in the X axis direction is narrow, and inclined portions 34a and 34b of which a width in the X axis direction gradually decreases toward the narrow portion 36 from the broad portion 32. In the driving arm 30, the broad portion 32, the inclined portion 34a, the narrow portion 36, and the inclined portion 34b are repeatedly formed in this order toward the leading end direction of the driving arm 30 to the +X side of the base portion 10, and four broad portions 32 are disposed. The inclined portion 34a or the inclined portion 34b is disposed between the broad portion 32 and the narrow portion 36, and thus it is possible to increase rigidity of the driving arm 30.

In a position overlapping with the broad portion 32 of the driving arm 30, a through hole 38 opening in the Z axis direction is disposed. By disposing the broad portion 32 in the driving arm 30, a broad through hole 38 opening in the X axis direction is able to be disposed. The through hole 38 is in the shape of a round cornered rectangle in which corner portions of the rectangle having a long side in the Y axis direction are rounded. A rounded corner portion of the round cornered rectangle is arranged along the inclined portions 34a and 34b, and thus the broad through hole 38 opening in the Y axis direction is able to be disposed.

The through holes 28 and 38 of which an opening area in the X axis direction and the Y axis direction is large are able to be disposed in the broad portions 22 and 32 of the driving arms 20 and 30, and thus the resonator element 1 is able to suppress a decrease in an etching rate due to a microloading effect when the resonator element 1 is formed by a dry etching method, and a decrease in production efficiency according thereto.

The through holes 28 and 38 having a large opening area are formed, and thus when the broad portions 22 and 32 are disposed in the driving arms 20 and 30 of the resonator element 1 vibrating at a predetermined frequency, a vibrational frequency of the resonator element 1 would exceed the predetermined frequency. In the related art, it is necessary to elongate a length of the driving arms 20 and 30 in the Y axis direction in order to decrease the vibrational frequency of the resonator element 1, but external dimensions of the resonator element 1 increase. Therefore, in this embodiment, the narrow portions 26 and 36 for decreasing a vibrational frequency are disposed in the driving arms 20 and 30 of the resonator element 1. Accordingly, an increase in a vibrational frequency due to the broad portions 22 and 32 is able to be suppressed by the narrow portions 26 and 36.

Furthermore, a case where the through holes 28 and 38 in the shape of a round cornered rectangle are disposed in the position overlapping with the broad portions 22 and 32 is described, but the shape is not limited thereto. For example, the through holes 28 and 38 may be in the shape of a rectangle in which at least one corner portion of the rectangle is rounded, in a shape of which a rounded corner portion is formed in a polygon, in the shape of an ellipse, and the like.

FIG. 2 is a cross-sectional view cut along line A-A in FIG. 1A.

As illustrated in FIG. 2, a first driving electrode 42 is formed in two outside surfaces of the driving arm 20 in the X axis direction. A second driving electrode 44 is formed in two inside surfaces of the through hole 28 which is disposed in the position overlapping with the broad portion 22 of the driving arm 20 in the X axis direction.

A second driving electrode 44 is formed in two outside surfaces of the driving arm 30 in the X axis direction. A first driving electrode 42 is formed in two inside surfaces of the through hole 38 which is disposed in the position overlapping with the broad portion 32 of the driving arm 30 in the X axis direction.

When alternating current voltages of which phases are different by 180 degrees is applied to the first driving electrode 42 and the second driving electrode 44, the resonator element 1 repeats a bending movement displacing the driving arm 20 and the driving arm 30 in reverse directions from each other along an in-plane direction (an XY plane direction), and performs a bending vibration at a predetermined frequency.

As described above, the through holes 28 and 38 are disposed in the driving arms 20 and 30, and thus the first driving electrode 42 or the second driving electrode 44 is able to be arranged in the inside surfaces of the through holes 28 and 38 and the outside surfaces of the driving arms 20 and 30. Accordingly, an electric field is able to be effectively generated between the first driving electrode 42 and the second driving electrode 44, and thus the resonator element 1 having low impedance is able to be obtained.

A configuration of the first driving electrode 42 and the second driving electrode 44 is not particularly limited, and the first driving electrode 42 and the second driving electrode 44 are able to be formed of a metal material such as gold (Au), a gold alloy, platinum (Pt), aluminum (Al), an aluminum alloy, silver (Ag), a silver alloy, chromium (Cr), a chromium alloy, copper (Cu), molybdenum (Mo), niobium (Nb), tungsten (W), iron (Fe), titanium (Ti), cobalt (Co), zinc (Zn), and zirconium (Zr), and a conductive material such as indium tin oxide (ITO).

Figure 3B:
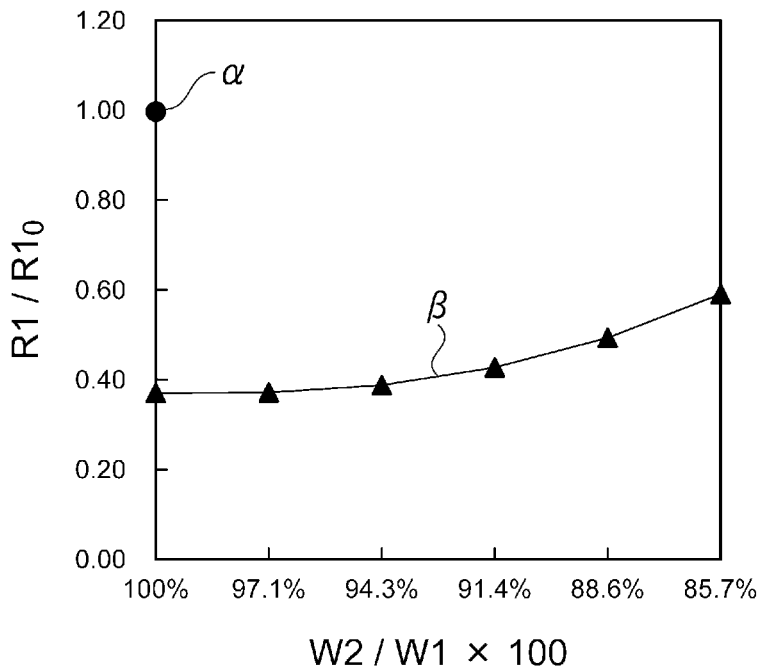

FIGS. 3A and 3B are graphs illustrating a relationship between a narrow portion/a broad portion and vibrational frequency, and a relationship between a narrow portion/a broad portion and impedance.

In FIG. 3A, a relationship between a narrow portion/a broad portion and vibrational frequency is illustrated.

A horizontal axis of FIG. 3A indicates the width W2 of the narrow portions 26 and 36 in the X axis direction based on the width W1 of the broad portions 22 and 32 in the X axis direction as a ratio (a percentage).

A vertical axis of FIG. 3A indicates a vibrational frequency f at the time of disposing the narrow portions 26 and 36 as a reference frequency on the basis of a vibrational frequency $f_0$ when the width W2 of the narrow portions 26 and 36 in the X axis direction and the width W1 of the broad portions 22 and 32 in the X axis direction are identical to each other (when the narrow portions 26 and 36 are not disposed).

The graph illustrated in FIG. 3A indicates a change in the vibrational frequency f when the width W2 of the narrow portions 26 and 36 of the resonator element 1 is narrowed with respect to the width W1 of the broad portions 22 and 32. As illustrated in this graph, even when the width W2 of the narrow portions 26 and 36 is slightly narrowed to be 99% of the width W1 of the broad portions 22 and 32, it is possible to confirm an effect of decreasing the vibrational frequency f of the resonator element 1. The narrow portions 26 and 36 are able to decrease a vibrational frequency which has been increased by the broad portions 22 and 32 disposed in the driving arms 20 and 30 in order to dispose the through holes 28 and 38 having a large opening area in the X axis direction.

In FIG. 3B, a relationship between a narrow portion/a broad portion and impedance is illustrated.

A horizontal axis of FIG. 3B indicates the width W2 of the narrow portions 26 and 36 in the X axis direction based on the width W1 of the broad portions 22 and 32 in the X axis direction as a ratio (a percentage).

A vertical axis of FIG. 3B indicates impedance R1 at the time of disposing the narrow portions 26 and 36 and the through holes 28 and 38 as a reference impedance on the basis of impedance $R1_0$ when the width W2 of the narrow portions 26 and 36 in the X axis direction and the width W1 of the broad portions 22 and 32 in the X axis direction are identical to each other (when the narrow portions 26 and 36 are not disposed) and when the through holes 28 and 38 are not disposed.

In FIG. 3B, a dot α indicates reference impedance $R1_0$ (1.0) when the narrow portions 26 and 36 and the through holes 28 and 38 are not disposed in the driving arms 20 and 30, and a curved line β indicates a change in the impedance R1 when the through holes 28 and 38 are disposed in the driving arms 20 and 30, and the width W2 of the narrow portions 26 and 36 of the resonator element 1 is narrowed with respect to the width W1 of the broad portions 22 and 32.

As illustrated by the curved line β, the impedance R1 of the resonator element 1 increases as the width of the narrow portions 26 and 36 becomes narrower. However, in the resonator element 1 of this embodiment, the through holes 28 and 38 for decreasing the impedance R1 are disposed. The width W2 of the narrow portions 26 and 36 is greater than or equal to 88% of the width W1 of the broad portions 22 and 32, and thus it is possible to realize the resonator element 1 having a low impedance of less than or equal to 50% of the reference impedance $R1_0$ at which the inventors were aiming.

Furthermore, in this embodiment, a case where quartz crystal is used as the base material of the resonator element 1 is described, but the material is not limited thereto. The resonator element 1 is able to be formed of a piezoelectric single crystal such as lithium tantalate, and lithium niobate, a piezoelectric material such as a lead zirconate titanate piezoelectric ceramic or the like, or a silicon semiconductor material other than quartz crystal.

As described above, the following effects are able to be obtained according to the resonator element 1 according to this Embodiment 1.

The resonator element 1 of this embodiment includes the two driving arms 20 and 30 which extend in parallel with a +Y axis direction from the +Y side of the base portion 10 and are able to vibrate along the in-plane direction (an XY in-plane direction) in a plan view from a +Z axis direction. The driving arms 20 and 30 include the broad portions 22 and 32, the narrow portions 26 and 36, and the inclined portions 24a, 24b, 34a, and 34b. The through holes 28 and 38 having a large opening area which are disposed in the broad portions 22 and 32 decrease impedance of the resonator element 1, and are able to suppress a decrease in an etching rate due to a microloading effect, and a decrease in production efficiency according thereto. The narrow portions 26 and 36 are able to decrease an increase in a vibrational frequency due to the broad portions 22 and 32 without increasing the external dimensions of the resonator element 1. Therefore, it is possible to provide the resonator element 1 having high production efficiency and low impedance in a small size.

Electronic Device-1

Figure 4:
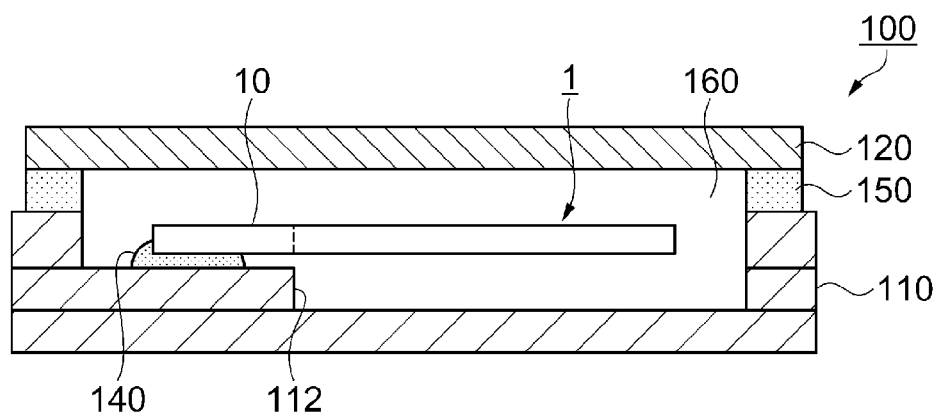
FIG. 4 is a cross-sectional view schematically illustrating a tuning fork type vibrator as an electronic device including the resonator element.

Next, a tuning fork type vibrator as an electronic device to which the resonator element 1 according to the invention is applied will be described. FIG. 4 is a cross-sectional view schematically illustrating a tuning fork type vibrator 100 including the resonator element 1 according to the invention.

The tuning fork type vibrator 100 includes the resonator element 1, a package main body 110 formed in the shape of a rectangular box for containing the resonator element 1, and a lid 120. In the resonator element 1, the base portion 10 of the resonator element 1 is adhered to and supported on a supporting stand 112 formed in a package main body 110 which is formed of ceramic or the like through a fixation member 140 such as a conductive adhesive agent. In addition, wiring (not illustrated) is formed on a front surface of the supporting stand 112, the first driving electrode 42 and the second driving electrode 44 of the resonator element 1, and the wirings are electrically connected to each other through the fixation member 140. The tuning fork type vibrator 100 functions as a vibrator by applying a voltage to the resonator element 1.

It is preferable that the fixation member 140 is an elastic material. As the elastic fixation member 140, an adhesive agent including silicone as a base material or the like is known. A sealing portion 150 is disposed in an upper opening of the package main body 110, and the package main body 110 and the lid 120 are sealed through the sealing portion 150. Furthermore, a cavity 160 of the package main body 110 containing the resonator element 1 is in an inert gas atmosphere of nitrogen or the like or a reduced pressure atmosphere.

As described above, according to the tuning fork type vibrator 100, it is possible to provide an electronic device including the resonator element 1 having high production efficiency and low impedance in a small size.

Electronic Device-2

Figure 5:
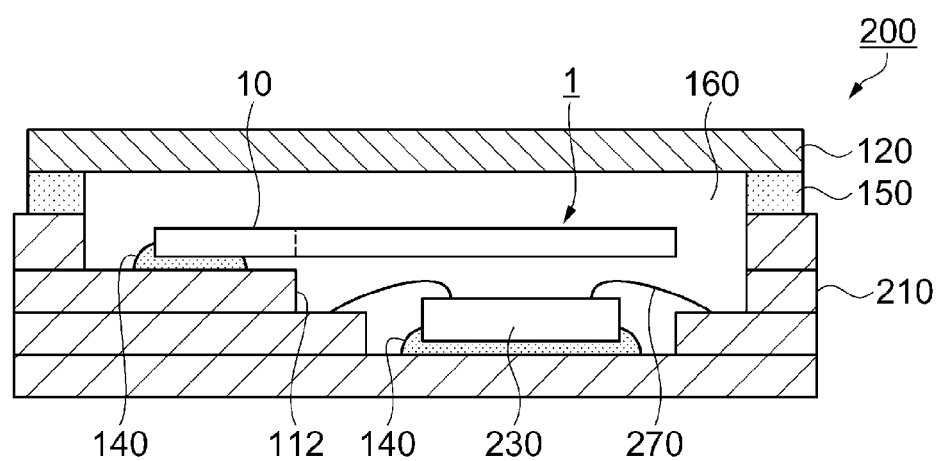
FIG. 5 is a cross-sectional view schematically illustrating a crystal oscillator as the electronic device including the resonator element.

Next, a crystal oscillator as an electronic device to which the resonator element 1 according to the invention is applied will be described. FIG. 5 is a cross-sectional view schematically illustrating a crystal oscillator 200 including the resonator element 1 according to the invention.

In the crystal oscillator 200 illustrated in FIG. 5, an IC chip 230 is arranged below the resonator element 1 of the tuning fork type vibrator 100 described above. Furthermore, the same reference numerals are applied to the same constituents as that of the tuning fork type vibrator 100 (Electronic Device-1), and the repeated description will be omitted.

The crystal oscillator 200 includes the resonator element 1, the IC chip 230, a package main body 210 formed in the shape of a rectangular box for containing the resonator element 1 and the IC chip 230, and the lid 120. A cavity containing the IC chip 230 is disposed in a bottom surface of the package main body 210, and the IC chip 230 is adhered into the cavity through the fixation member 140. Wiring (not illustrated) is formed on a bottom surface of the package main body 210, and the IC chip 230 and the wirings are electrically connected to each other by a wire 270 of Au (gold) or the like. When the resonator element 1 vibrates, the vibration is input into the IC chip 230, then a predetermined frequency signal is produced, and thus the crystal oscillator 200 functions as an oscillator.

As described above, according to the crystal oscillator 200, it is possible to provide an electronic device including the resonator element 1 having high production efficiency and low impedance in a small size.

Embodiment 2

Gyro Sensor Element

Figure 6:
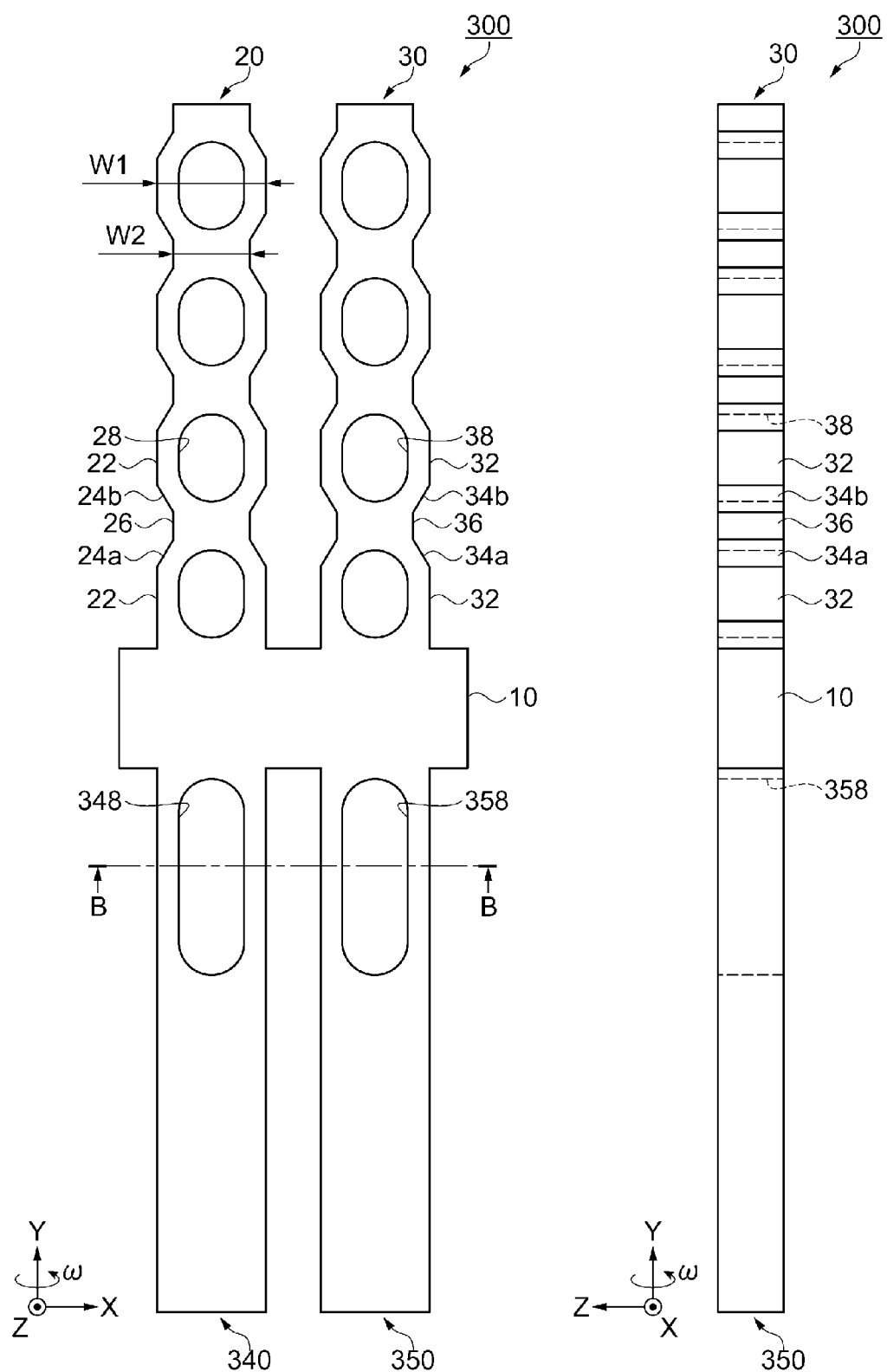
FIGS. 6A and 6B are a schematic plan view and a side view schematically illustrating a configuration of a gyro sensor element according to Embodiment 2.
Figure 7:
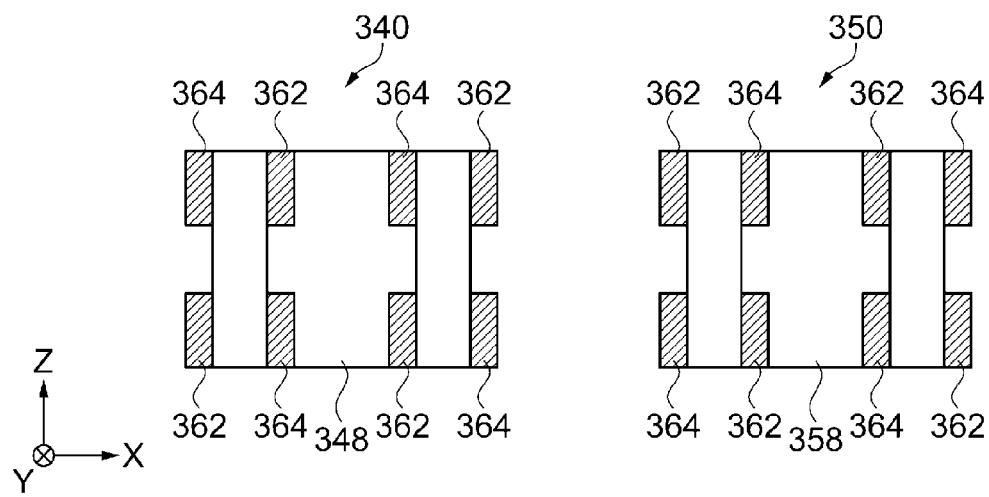
FIG. 7 is a cross-sectional view cut along line B-B in FIG. 6A.

FIG. 6A is a schematic plan view schematically illustrating a configuration of a gyro sensor element according to Embodiment 2. FIG. 6B is a side view thereof. FIG. 7 is a cross-sectional view cut along line B-B in FIG. 6A.

First, a schematic configuration of the gyro sensor element according to Embodiment 2 will be described with reference to FIGS. 6A and 6B and FIG. 7. Furthermore, the gyro sensor element of this embodiment includes the driving arms 20 and 30 having the same configuration as that of resonator element 1 described in Embodiment 1. The same reference numerals are applied to the same constituents as that of the resonator element 1, and the repeated description will be omitted.

As illustrated in FIGS. 6A and 6B, a gyro sensor element 300 includes the base portion 10, the pair of driving arms 20 and 30 extending from the base portion 10, a pair of detection arms 340 and 350 extending from the base portion 10 on a side opposite to the driving arms 20 and 30, and the like. Specifically, the gyro sensor element 300 includes the pair of driving arms 20 and 30 in the shape of a prism which extend approximately in parallel with each other in the +Y axis direction from one end of the approximately rectangular flat plate-like base portion 10 on the +Y side, and the pair of detection arms 340 and 350 in the shape of a prism which extend approximately in parallel with each other in a −Y axis direction from one end of the base portion 10 on a −Y side.

In the detection arm 340, a through hole 348 opening in the Z axis direction is disposed toward a leading end side (the −Y side) of the detection arm 340 from the base portion 10 side of the detection arm 340. The through hole 348 is in the shape of a round cornered rectangle in which corner portions of the rectangle having a long side in the Y axis direction are rounded.

In the detection arm 350, a through hole 358 opening in the Z axis direction is disposed toward a leading end side (the −Y side) of the detection arm 350 from the base portion 10 side of the detection arm 350. The through hole 358 is in the shape of a round cornered rectangle in which corner portions of the rectangle having a long side in the Y axis direction are rounded.

Furthermore, a case where the through holes 348 and 358 in the shape of a round cornered rectangle are disposed in the detection arms 340 and 350 is described, but the shape is not limited thereto. For example, the through holes 348 and 358 may be in the shape of a rectangle in which at least one corner portion of the rectangle is rounded, in a shape of which a rounded corner portion is formed in a polygon, in the shape of an ellipse, and the like.

In the driving arms 20 and 30, the broad portions 22 and 32 are disposed in order to prevent a decrease in an etching rate due to a microloading effect, and in the broad portions 22 and 32, the through holes 28 and 38 having a large opening area are disposed. The broad portions 22 and 32 disposed in the driving arms 20 and 30 cause an increase in a vibrational frequency, a frequency difference between an in-plane vibrational frequency of the driving arms 20 and 30 in the in-plane direction and an out-of-plane vibrational frequency of the detection arms 340 and 350 in an out-of-plane direction occurs, and detection sensitivity of an angular velocity ω described later decreases. In the related art, a method of elongating a length of the driving arms 20 and 30 is used in order to adjust these frequencies, but the external dimensions of the resonator element 1 increase. In addition, a method of thickening a thickness of the detection arms 340 and 350 (in the Z axis direction) is used, but production efficiency and processing accuracy decrease. Therefore, in this embodiment, the narrow portions 26 and 36 for decreasing a vibrational frequency are disposed in the driving arms 20 and 30. Accordingly, it is possible to make the in-plane vibrational frequency of the driving arms 20 and 30 in the in-plane direction and the out-of-plane vibrational frequency of the detection arms 340 and 350 in the out-of-plane direction approximately identical to each other.

FIG. 7 is a cross-sectional view cut along line B-B in FIG. 6A.

As illustrated in FIG. 7, in an outside surface of the detection arm. 340 in a +X axis direction, a first detection electrode 362 is formed on a +Z side of the outside surface, and a second detection electrode 364 is formed on a −Z side of the outside surface. In the outside surface of the detection arm 340 in a −X axis direction, the second detection electrode 364 is formed on the +Z side of the outside surface, and the first detection electrode 362 is formed on the −Z side of the outside surface.

In an inside surface of the through hole 348 in the +X axis direction which is disposed in the detection arm 340, the second detection electrode 364 is formed on the +Z side of the inside surface, and the first detection electrode 362 is formed on the −Z side of the inside surface. In an inside surface of the through hole 348 in the −X axis direction which is disposed in the detection arm 340, the first detection electrode 362 is formed on the +Z side of the inside surface, and the second detection electrode 364 is formed on the −Z side of the inside surface.

In an outside surface of the detection arm 350 in the +X axis direction, the second detection electrode 364 is formed on the +Z side of the outside surface, and the first detection electrode 362 is formed on the −Z side of the outside surface. In an outside surface of the detection arm 350 in the −X axis direction, the first detection electrode 362 is formed on the +Z side of the outside surface, and the second detection electrode 364 is formed on the −Z side of the outside surface.

In an inside surface of the through hole 358 in the +X axis direction which is disposed in the detection arm 350, the first detection electrode 362 is formed on the +Z side of the inside surface, and the second detection electrode 364 is formed on the −Z side of the inside surface. In an inside surface of the through hole 358 in the −X axis direction which is disposed in the detection arm 350, the second detection electrode 364 is formed on the +Z side of the inside surface, and the first detection electrode 362 is formed on the −Z side of the inside surface.

Next, detection of an angular velocity applied to the gyro sensor element 300 will be described.

When alternating current voltages of which phases are different by 180 degrees are applied to the first driving electrode 42 and the second driving electrode 44 of the driving arms 20 and 30, the resonator element 1 performs a bending vibration (a driving mode) displacing the driving arm 20 and the driving arm 30 in reverse directions from each other along the in-plane direction (the XY plane direction). In the gyro sensor element 300 of this embodiment, the driving arms 20 and 30 having low impedance are used, and thus it is possible to perform a bending vibration with excellent efficiency. In a state of the driving mode, when an angular velocity co is applied around the Y axis, a Coriolis force is generated in the driving arms 20 and 30, and the driving arms 20 and 30 perform a bending vibration in the reverse directions from each other in the out-of-plane direction (the +Z axis direction and the −Z axis direction) intersecting with the in-plane direction.

The detection arms 340 and 350 resonate with the bending vibration of the driving arms 20 and 30 in the out-of-plane direction, and similarly, perform a bending vibration in the reverse directions from each other in the out-of-plane direction. At this time, an electric charge is generated between the first detection electrode 362 and the second detection electrode 364 by a piezoelectric effect. The gyro sensor element 300 is able to detect the angular velocity co applied to the gyro sensor element 300 by detecting the electric charge.

The through holes 348 and 358 are disposed in the detection arms 340 and 350, and the first detection electrode 362 and the second detection electrode 364 are able to be arranged in the outside surface of the detection arms 340 and 350 and the inside surface of the through holes 348 and 358. Accordingly, it is possible to effectively generate the electric charge between the first detection electrode 362 and the second detection electrode 364, and thus the gyro sensor element 300 having high detection sensitivity is able to be obtained.

As described above, the following effects are able to be obtained according to the gyro sensor element 300 according to this Embodiment 2.

The gyro sensor element 300 of this embodiment includes the two driving arms 20 and 30 which extend in parallel with the +Y axis direction from the +Y side of the base portion 10 and vibrate along the in-plane direction (the XY in-plane direction) in a plan view from the +Z axis direction, and the detection arms 340 and 350 which extend in parallel with the −Y axis direction from the −Y side of the base portion 10 and detect a vibration of the out-of-plane direction intersecting with the in-plane direction. The driving arms 20 and 30 include the broad portions 22 and 32, the narrow portions 26 and 36, and the inclined portions 24a, 24b, 34a, and 34b. The through holes 28 and 38 having a large opening area are disposed in the broad portions 22 and 32, and thus the broad portions 22 and 32 decrease impedance of the resonator element 1, and are able to suppress a decrease in an etching rate due to a microloading effect, and a decrease in production efficiency according thereto. The narrow portions 26 and 36 are able to eliminate a frequency difference between a vibrational frequency of the driving arms 20 and 30 and a vibrational frequency of the detection arms 340 and 350 which is generated due to the broad portions 22 and 32 without increasing the length of the driving arms 20 and 30 and the thickness of the detection arms 340 and 350. Therefore, it is possible to provide the gyro sensor element 300 having high production efficiency and low impedance in a small size.

Electronic Device-3

Figure 8:
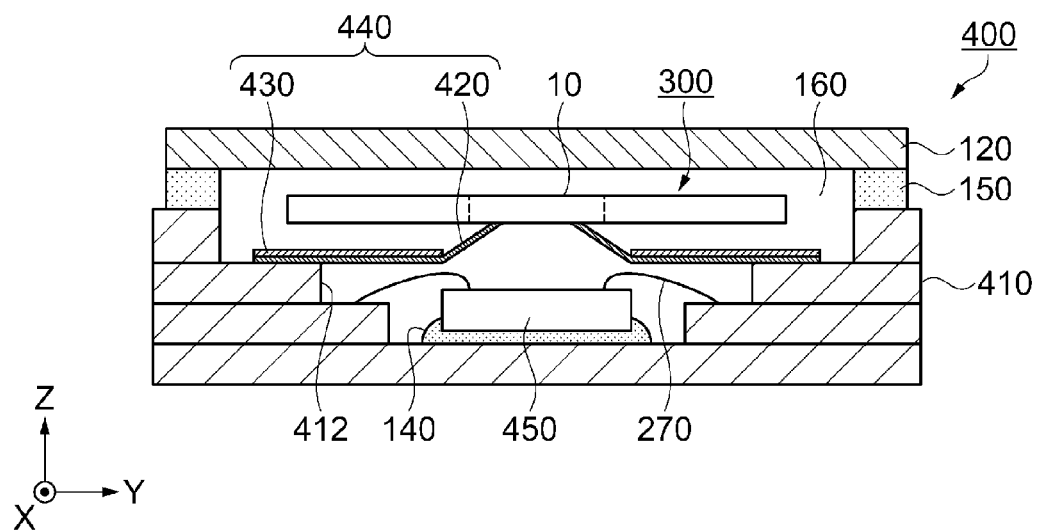
FIG. 8 is a cross-sectional view schematically illustrating a gyro device as an electronic device including the gyro sensor element.

Next, a gyro device as an electronic device to which the gyro sensor element 300 according to the invention is applied will be described. FIG. 8 is a cross-sectional view schematically illustrating a gyro device 400 including the gyro sensor element 300 according to the invention. Furthermore, the same reference numerals are applied to the same constituents as that of the tuning fork type vibrator 100 (Electronic Device-1), and the repeated description will be omitted.

As illustrated in FIG. 8, the gyro device 400 includes the gyro sensor element 300, an IC chip 450, a package main body 410 formed in the shape of a rectangular box for containing the gyro sensor element 300 and the IC chip 450, and the lid 120. The IC chip 450 is adhered to and supported on a bottom surface of the package main body 410 formed of ceramic or the like through the fixation member 140 such as an adhesive agent, and is electrically connected to wiring (not illustrated) which is formed in the package main body 410 by the wire 270 of Au (gold) or the like. The IC chip 450 includes a driving circuit driving the gyro sensor element 300, and a detection circuit outputting the angular velocity co applied to the gyro sensor element 300.

The gyro sensor element 300 is supported on an approximately frame-like substrate 440 which is fixed on a supporting stand 412 formed in the package main body 410 to surround the IC chip 450. The substrate 440 includes the substrate main body 430 formed of a polyimide resin or the like, and a tab tape 420 formed of a copper (Cu) metal foil or the like which is laminated on the supporting stand 412. In the substrate 440, a plurality of belt-like tab tapes 420 which is folded obliquely upward extends from an edge of the supporting stand 412 toward the center portion. A leading end of the tab tape 420 is electrically connected to wiring (not illustrated) which is formed on the base portion 10 of the gyro sensor element 300 through a joining member such as a bump. Accordingly, the gyro sensor element 300 is supported on the substrate 440 in parallel with the XY plane surface.

In the gyro device 400, the gyro sensor element 300 vibrates at a predetermined frequency along the in-plane direction according to a driving signal from the IC chip 450, and vibrates in the out-of-plane direction since the angular velocity co is applied around the Y axis. The IC chip 450 detects an electric charge generated by this vibration in the out-of-plane direction, and thus the gyro device 400 functions as a gyro sensor.

As described above, according to the gyro device 400, it is possible to provide an electronic device including the resonator element 1 having high production efficiency and low impedance in a small size.

Electronic Apparatus

Next, an electronic apparatus including the resonator element 1, the tuning fork type vibrator 100, the crystal oscillator 200, the gyro sensor element 300, or the gyro device 400 according to the embodiments of the invention will be described with reference to FIG. 9 to FIG. 12. Furthermore, in the description, an example using the resonator element 1 will be described.

Figure 9:
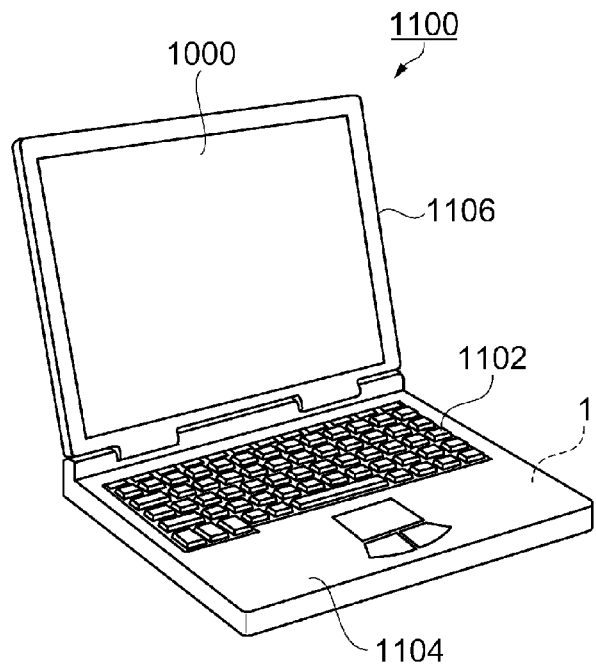
FIG. 9 is a perspective view illustrating a configuration of a mobile type (or a note type) personal computer as an electronic apparatus including the resonator element or the gyro sensor element.

FIG. 9 is a perspective view schematically illustrating a configuration of a mobile type (or a note type) personal computer 1100 as an electronic apparatus including the resonator element 1 according to one embodiment of the invention. In this drawing, the personal computer 1100 includes a main body portion 1104 provided with a keyboard 1102, and a display unit 1106 provided with a display unit 1000, and the display unit 1106 is rotatably supported on the main body portion 1104 through a hinge structure portion. In such a personal computer 1100, the resonator element 1 for outputting a reference signal is built in.

Figure 10:
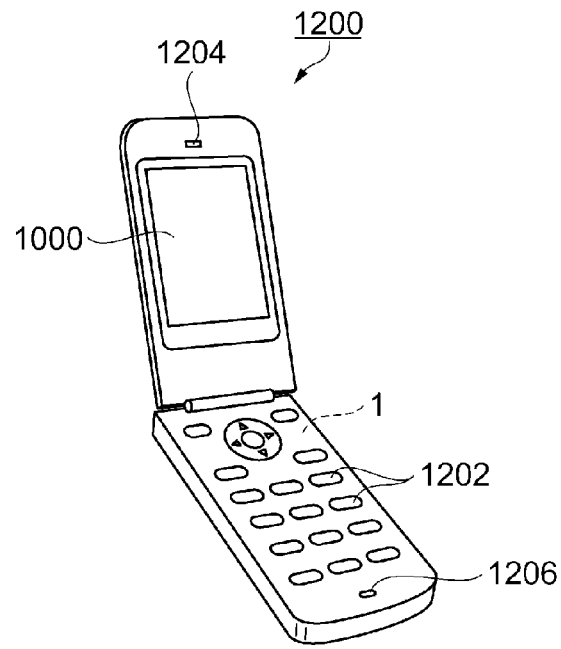
FIG. 10 is a perspective view illustrating a mobile phone as the electronic apparatus including the resonator element or the gyro sensor element.

FIG. 10 is a perspective view schematically illustrating a configuration of a mobile phone 1200 (including a PHS) as an electronic apparatus including the resonator element 1 according to one embodiment of the invention. In this drawing, the mobile phone 1200 includes a plurality of manipulation buttons 1202, an earpiece 1204, and a mouth piece 1206, and a display unit 1000 is arranged between the manipulation buttons 1202 and the ear piece 1204. In such a mobile phone 1200, the resonator element 1 for outputting a reference signal is built in.

Figure 11:
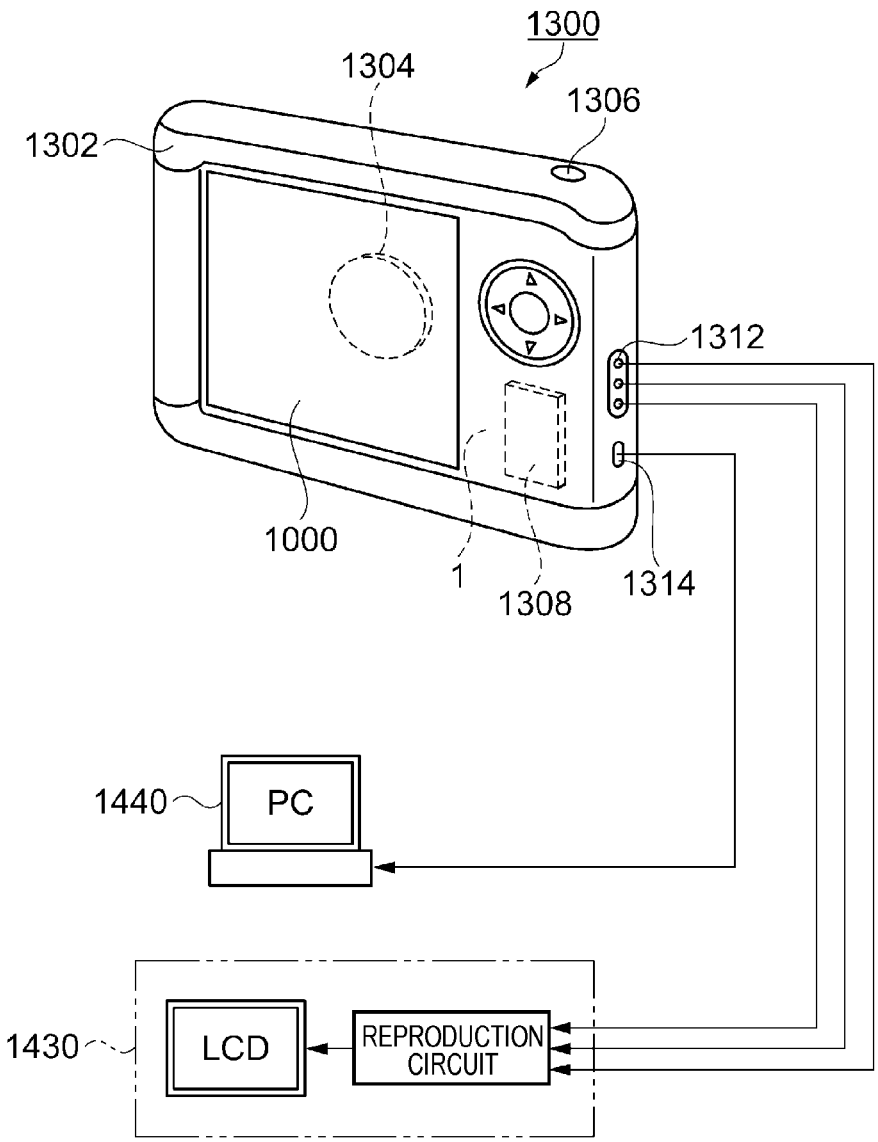
FIG. 11 is a perspective view illustrating a digital still camera as the electronic apparatus including the resonator element or the gyro sensor element.

FIG. 11 is a perspective view schematically illustrating a configuration of a digital still camera 1300 as an electronic apparatus including the resonator element 1 according to one embodiment of the invention. Furthermore, in this drawing, a connection with respect to an external instrument is simply illustrated. Here, in a film camera of the related art, a silver halide photographic film is exposed by a light image of a photographic subject, whereas the digital still camera 1300 generates an image capturing signal (an image signal) by performing photoelectric conversion with respect to the light image of the photographic subject by an image capturing element such as a Charge Coupled Device (CCD).

The display unit 1000 is disposed on a back surface of a case (body) 1302 in the digital still camera 1300, display is performed on the basis of the image capturing signal of the CCD, and the display unit 1000 functions as a viewfinder displaying the photographic subject as an electronic image. In addition, a light receiving unit 1304 including an optical lens (an image capturing optical system), a CCD or the like is disposed on a front surface side (a rear surface side in the drawing) of the case 1302.

When a photographer confirms a photographic subject image displayed on the display unit 1000 and presses a shutter button 1306, an image capturing signal of the CCD at this time is transmitted to and stored in a memory 1308. In addition, in this digital still camera 1300, a video signal output terminal 1312, and an input and an output terminal for data communication 1314 are disposed on a side surface of the case 1302. Then, as illustrated, a TV monitor 1430 is connected to the video signal output terminal 1312, and a personal computer 1440 is connected to the input and output terminal for data communication 1314, as necessary. Further, according to a predetermined manipulation, the image capturing signal stored in the memory 1308 is output to the TV monitor 1430 or the personal computer 1440. In such a digital still camera 1300, the resonator element 1 for outputting a reference signal is built in.

Furthermore, the resonator element 1 according to one embodiment of the invention is able to be applied to, for example, an electronic apparatus such as an ink jet discharge device (for example, an ink jet printer), a laptop personal computer, a television, a video camera, a video tape recorder, a car navigation device, a pager, an electronic notebook (including an electronic notebook having a communication function), an electronic dictionary, an electronic calculator, an electronic game device, a word processor, a workstation, a videophone, a security television monitor, electronic binoculars, a POS terminal, medical equipment (for example, an electronic thermometer, a sphygmomanometer, a blood glucose meter, an electrocardiogram measuring device, an ultrasonic diagnostic apparatus, an electronic endoscope), a fish finder, various measuring instruments, gauges (for example, gauges of a vehicle, an aircraft, and a ship), and a flight simulator in addition to the personal computer 1100 (a mobile type personal computer) of FIG. 9, the mobile phone 1200 of FIG. 10, and the digital still camera 1300 of FIG. 11.

Moving Object

Figure 12:
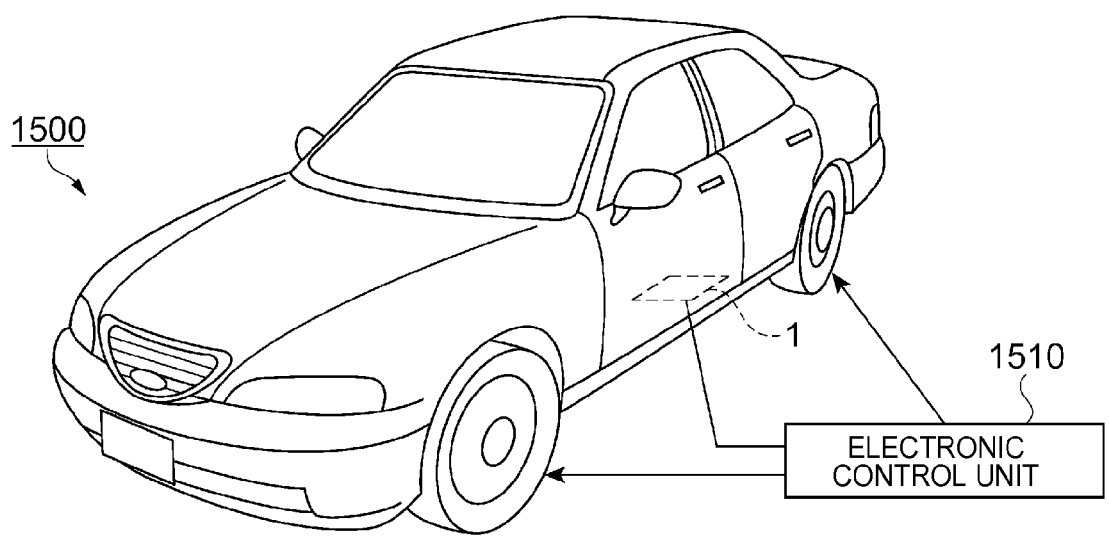
FIG. 12 is a perspective view illustrating an automobile as a moving object including the resonator element or the gyro sensor element.

FIG. 12 is a perspective view schematically illustrating an automobile as an example of a moving object. In an automobile 1500, the resonator element 1 according to the invention is mounted. For example, as illustrated in this drawing, in the automobile 1500 as a moving object, an electronic control unit 1510 incorporating the vibrating element 1 therein and controlling wheels or the like is mounted on a vehicle body. In addition, the resonator element 1 is able to be widely applied to an electronic control unit (ECU) such as keyless entry, an immobilizer, a car navigation system, a car air conditioner, an anti-lock brake system (ABS), an airbag, a tire pressure monitoring system (TPMS), engine control, a battery monitor of a hybrid automobile or an electric automobile, and a vehicle body posture control system.

The entire disclosure of Japanese Patent Application No. 2014-056091, filed Mar. 19, 2014 is expressly incorporated by reference herein.

What is claimed is:

1. A resonator element, comprising:
a base portion; and
a driving arm extending from the base portion and including a through hole,
wherein the driving arm includes a plurality of broad portions of which a width is broad, and a plurality of narrow portions of which a width is narrower than that of the broad portion,
the broad portion and the narrow portion alternate with each other, and
the through hole is disposed in a position overlapping with the broad portion.

2. The resonator element according to claim 1,
wherein the driving arm includes an inclined portion of which a width in an in-plane direction gradually decreases toward the narrow portion from the broad portion of the driving arm.

3. The resonator element according to claim 2,
wherein the width of the narrow portion is greater than or equal to 88% and less than or equal to 99% of the broad portion.

4. The resonator element according to claim 3,
wherein the through hole is approximately in the shape of a rectangle having a long side in an extending direction of the driving arm in which at least one corner portion of the rectangle is rounded when the driving arm is seen from a penetration direction of the through hole.

5. A gyro sensor element, comprising:
the resonator element according to claim 3; and
a detection arm extending from the base portion on a side opposite to the base portion side from which the driving arm extends and detecting a vibration in a direction intersecting with a vibration direction of the driving arm.

6. The resonator element according to claim 2,
wherein the through hole is approximately in the shape of a rectangle having a long side in an extending direction of the driving arm in which at least one corner portion of the rectangle is rounded when the driving arm is seen from a penetration direction of the through hole.

7. A gyro sensor element, comprising:
the resonator element according to claim 2; and
a detection arm extending from the base portion on a side opposite to the base portion side from which the driving arm extends and detecting a vibration in the in-plane direction and an out-of-plane direction intersecting with a vibration direction of the driving arm.

8. An electronic device comprising the gyro sensor element according to claim 7 mounted in the electronic device.

9. A moving object comprising the gyro sensor element according to claim 7 contained in the moving object.

10. An electronic device comprising the resonator element according to claim 2 mounted in the electronic device.

11. A moving object comprising the resonator element according to claim 2 contained in the moving object.

12. The resonator element according to claim 1,
wherein the width of the narrow portion is greater than or equal to 88% and less than or equal to 99% of the broad portion.

13. The resonator element according to claim 12,
wherein the through hole is approximately in the shape of a rectangle having a long side in an extending direction of the driving arm in which at least one corner portion of the rectangle is rounded when the driving arm is seen from a penetration direction of the through hole.

14. A gyro sensor element, comprising:
the resonator element according to claim 12; and
a detection arm extending from the base portion on a side opposite to the base portion side from which the driving arm extends and detecting a vibration in a direction intersecting with a vibration direction of the driving arm.

15. The resonator element according to claim 1,
wherein the through hole is approximately in the shape of a rectangle in which at least one corner portion of the rectangle is rounded when the driving arm is seen from a penetration direction of the through hole.

16. A gyro sensor element, comprising:
the resonator element according to claim 1; and
a detection arm extending from the base portion on a side opposite to the base portion side from which the driving arm extends and detecting a vibration in a direction intersecting with a vibration direction of the driving arm.

17. The gyro sensor element according to claim 16,
wherein the detection arm includes a through hole which is approximately in the shape of a rectangle toward a leading end direction of the detection arm from the base portion side of the detection arm when seen from the vibration direction of the detection arm.

18. An electronic device comprising the gyro sensor element according to claim 16 mounted in the electronic device.

19. A moving object comprising the gyro sensor element according to claim 16 contained in the moving object.

20. An electronic device comprising the resonator element according to claim 1 mounted in the electronic device.

21. A moving object comprising the resonator element according to claim 1 contained in the moving object.

* * * * *